United States Patent
Kasperkovitz

(10) Patent No.: US 7,506,016 B2
(45) Date of Patent: Mar. 17, 2009

(54) MULTIPLIER DEVICE

(75) Inventor: Wolfdietrich Georg Kasperkovitz, Waalre (NL)

(73) Assignee: Semiconductor Ideas to Market (ITOM) B.V. (NL)

( * ) Notice: Subject to any disclaimer, the term of this patent is extended or adjusted under 35 U.S.C. 154(b) by 461 days.

(21) Appl. No.: 10/581,659

(22) PCT Filed: Dec. 1, 2004

(86) PCT No.: PCT/EP2004/013742

§ 371 (c)(1),
(2), (4) Date: May 31, 2006

(87) PCT Pub. No.: WO2005/055414

PCT Pub. Date: Jun. 16, 2005

(65) Prior Publication Data

US 2007/0112904 A1    May 17, 2007

(51) Int. Cl.
*G06F 7/52*    (2006.01)
(52) U.S. Cl. ..................................... 708/620
(58) Field of Classification Search ......... 708/620–632, 708/524
See application file for complete search history.

(56) References Cited

U.S. PATENT DOCUMENTS

| 3,962,551 | A |   | 6/1976 | Gay |
| 5,220,607 | A |   | 6/1993 | Rebel |
| 5,566,102 | A | * | 10/1996 | Kubo ........................ 708/524 |
| 7,286,624 | B2 | * | 10/2007 | Woo et al. .................... 375/356 |
| 2002/0105745 | A1 | * | 8/2002 | Kim ........................... 360/39 |

* cited by examiner

*Primary Examiner*—Tan V Mai
(74) *Attorney, Agent, or Firm*—Robert M. McDermott, Esq.

(57) ABSTRACT

Multiplier device comprising first to $n^{th}$ multipliers $M_1$ to $M_n$ for multiplying a carrier modulated information signal with first to $n^{th}$ mutually phase shifted and identical, substantially square wave mixing signals $MS_1$ to $MS_n$ with 50% duty cycle. In order to eliminate fifth or higher order interferences from the output of said multiplier device according to the invention, n is greater than 2, outputs of said multipliers $M_1$ to $M_n$ are respectively coupled through weighting circuits $W_1$ to $W_n$ with respective fixed weighting factors $WF_1$ to $WF_n$ to an adder circuit, said mixing signals $MS_1$ to $MS_n$ having respective phase angles $\phi_i$ corresponding to $\phi_i = i*\Delta\phi$, said weighting factors $WF_i$ corresponding to the sine value of said respective phase angles $\phi_i = i*\Delta\phi$ with $\Delta\phi$ being the mutual phase difference between each two phase consecutive mixing signals corresponding to $\pi/(n+1)$ and i varying from 1 to n.

12 Claims, 2 Drawing Sheets

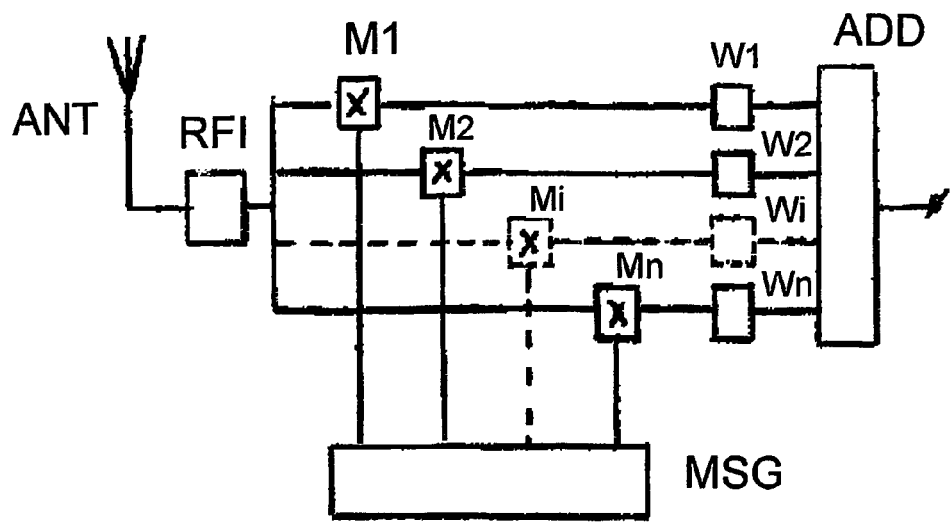
Figure 1
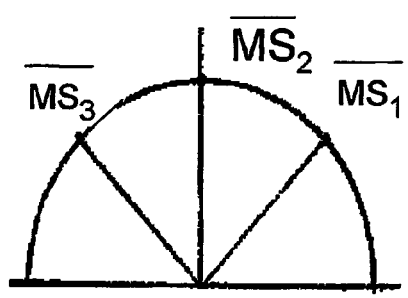
Figure 2A
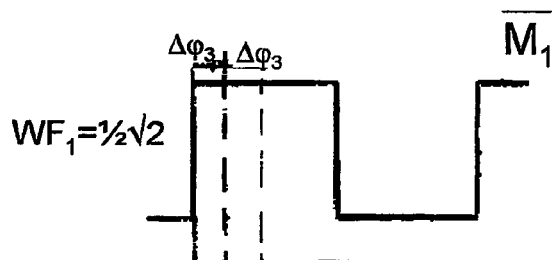
Figure 2B
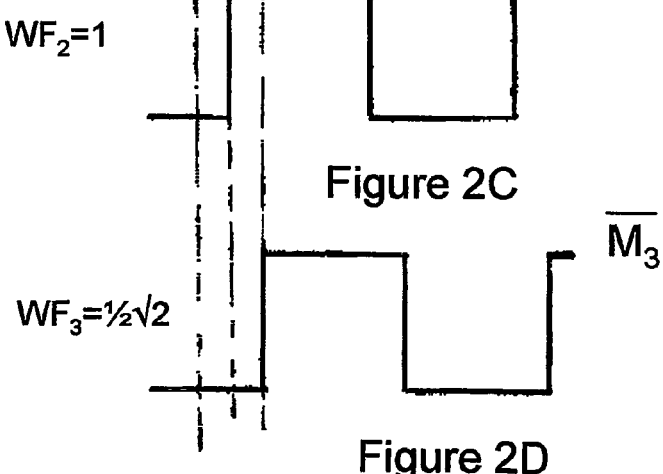
Figure 2C
Figure 2D

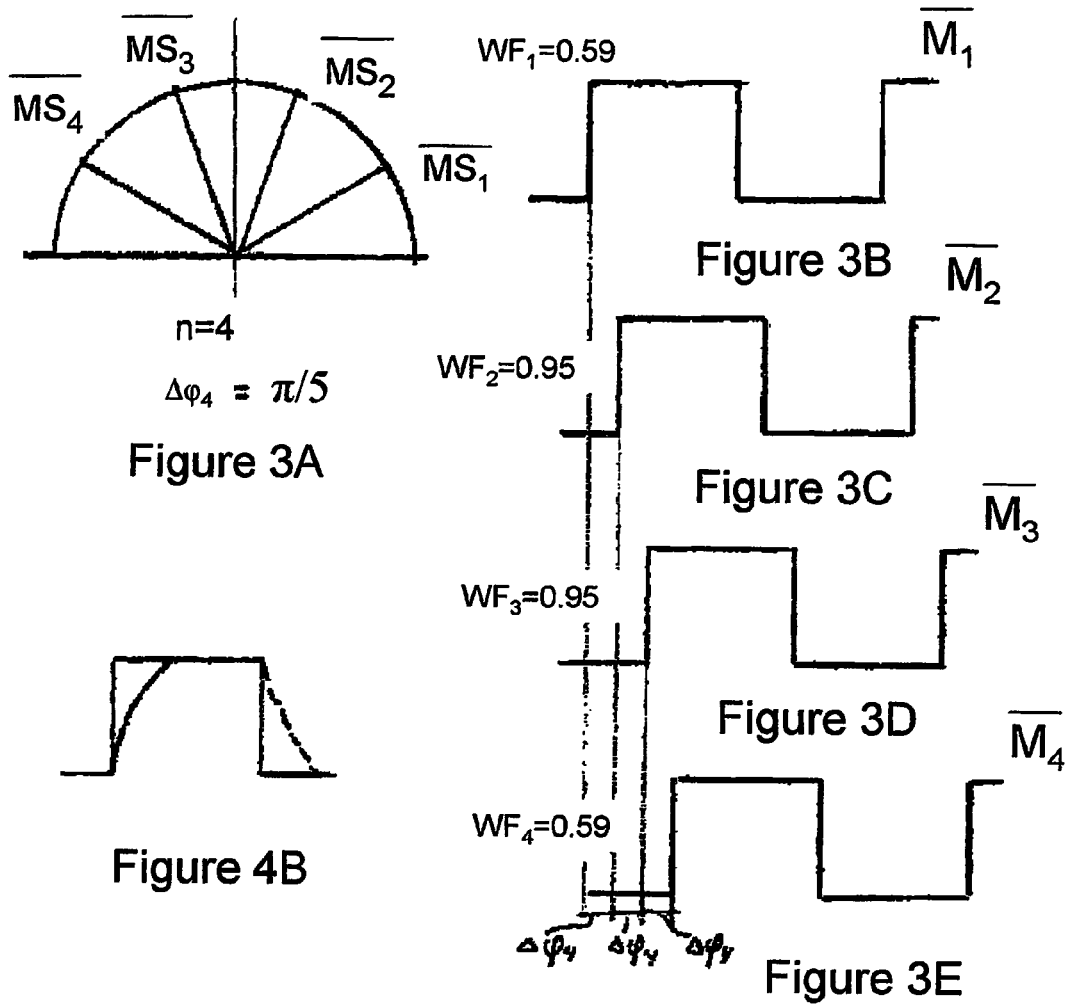
Figure 3A
Figure 3B
Figure 3C
Figure 3D
Figure 3E
Figure 4B
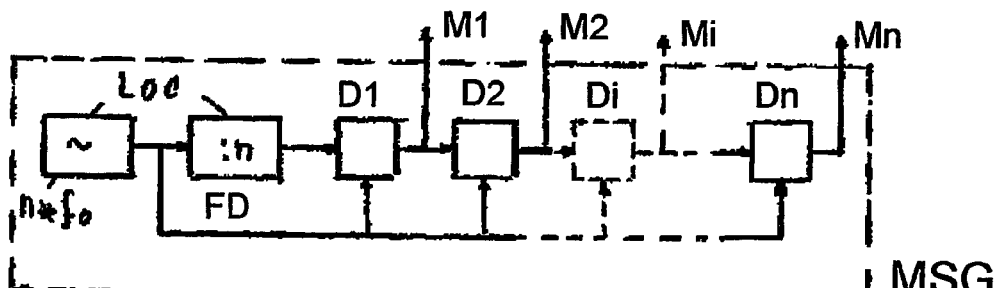
Figure 4A

MULTIPLIER DEVICE

The invention relates to a multiplier device comprising first to $n^{th}$ multipliers $M_1$ to $M_n$ for multiplying a carrier modulated information signal with first to $n^{th}$ mutually phase shifted and identical, substantially square wave mixing signals $MS_1$ to $MS_n$ with 50% duty cycle. Such multiplier devices are frequently used in receivers for converting an RF antenna input signal with an RF carrier frequency $f_{RF}$ into an intermediate frequency (IF) signal with an IF carrier frequency $f_{IF}$ and/or for demodulating an (IF) carrier modulated information signal with carrier frequency fc into baseband, or as used in stereodecoder circuits for decoding and/or demultiplexing a stereo multiplex signal into left and right baseband stereosignals.

A stereodecoder circuit using such multiplier device to demodulate a stereo difference signal (L−R) double sideband amplitude modulated on a subcarrier fc of 38 kHz into baseband, is e.g. known from U.S. Pat. No. 3,962,551. This known multiplier device comprises first and second multipliers $M_1$ and $M_2$, receiving said stereo difference signal (L−R) modulated 38 kHz subcarrier as well as respectively first and second identical, substantially square wave mixing signals $MS_1$ and $MS_2$ having a 38 kHz repetition or mixing frequency fo=fc and 50% duty cycle, mutually differing in phase by a phase angle $\Delta\phi$ of 60 degree. The mixing of the subcarrier modulated stereo difference signal (L−R) with said first and second mixing signals $MS_1$ and $MS_2$ will result not only in the wanted stereo difference signal (L−R), but also any undesired information signal in the region of 3fo=114 Khz being demodulated into baseband, due to the third order harmonic components 3fo of said mixing signals $MS_1$ and $MS_2$. However, the so obtained undesired baseband information signal occurring in the output signal of said first multiplier $M_1$ is identical but phase opposite to the undesired baseband information signal occurring in the output signal of said second multiplier $M_2$, hereinafter being referred to as third order interferences. By using an adder circuit following upon said first and second multipliers an addition of the wanted stereo difference signals (L−R) simultaneously with a compensation of the unwanted third order interference at the outputs of the first and second multipliers $M_1$ and $M_1$ is being obtained. The adder circuit therewith delivers the desired baseband stereo difference signals (L−R) free from unwanted third order interferences.

In practice, this known multiplier device appears to maintain its suppression of third order interferences when being used with a mixing frequency fo deviating from the carrier frequency fc, also at relatively high values of fc and/or fo causing the waveform of said mixing signals to deviate considerably from rectangular. This provided that the mutually identical correspondence in waveforms and the 50% duty cycle of said first and second mixing signals $MS_1$ and $MS_2$ are preserved.

However, due to the ongoing demand for higher performance/price ratio the suppression of third order interferences as provided for in the above known multiplier device does not suffice anymore.

On itself, a stereodecoder is known from U.S. Pat. No. 5,220,607, in which third and fifth order harmonic interferences are prevented from occurring in the output signal of a multiplier device by using a mixing signal having a specifically defined, rectangular multi-level waveform. This known interference suppression depends on the accuracy in maintaining said specific waveform. At frequencies increasing above the 38 kHz stereo difference signal (L−R) subcarrier frequency said waveform will be deteriorated by a.o. increasing non-linearities, making this known interference suppression unsuitable for receiver applications.

It is an object of the present invention to provide a robust, low cost multiplier device allowing for an effective suppression of all undesired higher order interferences, which is very well suitable for use in receivers for converting an RF antenna input signal into an IF signal.

Another object of the invention is to allow for a robust and low cost implementation.

Now, therefore, a multiplier device comprising first to $n^{th}$ multipliers $M_1$ to $M_n$ for multiplying a carrier modulated information signal with first to $n^{th}$ mutually phase shifted and identical, substantially square wave mixing signals $MS_1$ to $MS_n$ with 50% duty cycle according to the invention is characterized by n being greater than 2, outputs of said multipliers $M_1$ to $M_n$ being respectively coupled through weighting circuits $W_1$ to $W_n$ with respective fixed weighting factors $WF_1$ to $WF_n$ to an adder circuit, said mixing signals $MS_1$ to $MS_n$ having respective phase angles $\phi_i$ corresponding to $\phi_i=i*\Delta\phi$, said weighting factors $WF_i$ corresponding to the sine value of said respective phase angles $\phi_i=i*\Delta\phi$ with $\Delta\phi$ being the mutual phase difference between each two phase consecutive mixing signals corresponding to $\pi/(n+1)$ and i varying from 1 to n.

The invention is based on the insight that cancellation of interferences of any higher order in a multiplier device can be obtained with a properly chosen number n of multipliers and same number of mutually identical mixing signals with 50% duty cycle by using only the multiplication gains and phase angles of said mixing signals as parameters.

By applying the above measure according to the invention, the mutually identical 50% duty cycle waveform of the n mixing signals are chosen to be substantially rectangular, allowing for a multiple use of mutually identical costeffective non-linear multipliers, logic and other circuitry and adequate operation at high frequencies. The multiplication gains are being provided for with said weighting circuits $W_1$ to $W_n$, allowing for the use of mutually identical multipliers with mutually identical gain, which are easy to implement.

By chosing the mutual phase shift between the mixing signals and the weighting factors $WF_1$ to $WF_n$ of the weighting circuits $W_1$ to $W_n$ in accordance with the above the above measure according to the invention harmonic interferences up to the (2n−1) order are being suppressed. Or, vice versa, by chosing the number n to correspond to (N+1)/2 an elimination of all harmonics up to the $N^{th}$ order from the output of said adder circuit in accordance with the invention is obtained.

Another preferred embodiment of a multiplier device according to the invention which allows for a costeffective implementation is characterized by said mixing signals $MS_1$ to $MS_n$ being derived from a local oscillator signal with frequency fo through an arrangement of fixed phase shift means and/or frequency divider means.

A robust and accurate implementation of an embodiment of a multiplier device according to the invention is characterized by a local oscillator circuit supplying an oscillator signal with frequency fo to a serial arrangement of first to $n^{th}$ phase shifting means, each providing a fixed phase shift of $\Delta\phi$ and supplying respectively mixing signals $MS_1$ to $MS_n$ to said first to $n^{th}$ multipliers $M_1$ to $M_n$.

Preferably, said local oscillator circuit generates a clock control signal with clock frequency n*fo being supplied through a frequency divider with dividing factor n to said serial arrangement of first to $n^{th}$ phase shifting means, each of said first to $n^{th}$ phase shifting means comprising a D-flip-flop being clock controlled by said clock control signal and providing said fixed phase shift of $\Delta\phi$.

These and further aspects and advantages of the invention will be discussed more in detail hereinafter with reference to the disclosure of preferred embodiments, and in particular with reference to the appended Figures that show:

FIG. 1, a multiplier device according to the invention;

FIG. 2A, a graph for deriving the mutual phase difference between two phase consecutive mixing signals and weighting factors WF1 to WF3 in a multiplier device according to the invention for n=3;

FIGS. 2B to 2D, waveforms of identical, substantially square wave mixing signals $MS_1$ to $MS_3$ with 50% duty cycle for n=3;

FIG. 3A, a graph for deriving the mutual phase difference between two phase consecutive mixing signals and weighting factors WF1 to WF4 in a multiplier device according to the invention for n=4;

FIGS. 3B to 3E, waveforms of identical, substantially square wave mixing signals $MS_1$ to $MS_n$ with 50% duty cycle for n=4;

FIG. 4A, a mixing signal generator for generating first to $n^{th}$ mutually phase shifted and identical, substantially square wave mixing signals $MS_1$ to $MS_n$ with 50% duty cycle according to the invention;

FIG. 4B, deviations of mixing signals, which do not affect proper operation of the multiplier device according to the invention.

FIG. 1 shows an embodiment of a multiplier device (M1-Mn, W1-Wn, ADD) according to the invention used in a receiver front end. The receiver front end comprises an RF antenna ANT being coupled to an RF input unit RFI supplying an RF antenna input signal with an RF carrier frequency $f_{RF}$ in common to first to $n^{th}$ multipliers $M_1$ to $M_n$, being 3 or more. The RF antenna input signal is being demodulated therein into an intermediate frequency (IF) signal with an IF carrier frequency $f_{IF}$. Said first to $n^{th}$ multipliers $M_1$ to $M_n$ receive from a mixing signal generator MSG respectively first to $n^{th}$ mutually phase shifted and identical, substantially square wave mixing signals $MS_1$ to $MS_n$ with 50% duty cycle. Outputs of said first to $n^{th}$ multipliers $M_1$ to $M_n$ are respectively coupled through weighting circuits $W_1$ to $W_n$ with respective fixed weighting factors $WF_1$ to $WF_n$ to an adder circuit ADD. The adder circuit ADD provides at its output said IF signal without harmonic interferences up to the $(2n-1)^{th}$ order. According to the invention, said mixing signals $MS_1$ to $MS_n$ have respective phase angles $\phi_i$ corresponding to $\phi_i=i*\Delta\phi$, whereas said weighting factors $WF_i$ correspond to the sine value of said respective phase angles $\phi_i=i*\Delta\phi$ with $\Delta\phi$ being the mutual phase difference between each two phase consecutive mixing signals corresponding to $\pi/(n+1)$ and i varying from 1 to n.

By chosing n to correspond to (N+1)/2 elimination of all harmonics up to the $N^{th}$ order from the output of said adder circuit ADD is being obtained.

FIG. 2A shows how to determine the mutual phase difference between two phase consecutive mixing signals and the weighting factors WF1 to WF3 in a multiplier device according to the invention for an elimination of the third, fifth and seventh order harmonic interferences, i.e. for n=3.

FIGS. 2B to 2D show respectively first to third mutually identical, substantially square wave mixing signals $MS_1$ to $MS_3$ with 50% duty cycle having respective phase angles $\phi_1$ to $\phi_3$ corresponding to $\Delta\phi$, $2\Delta\phi$ and $3\Delta\phi$. Herein $\Delta\phi$ is the mutual phase difference between each two phase consecutive mixing signals corresponding to $\pi/(n+1)$, for n=3 being $\pi/4$. The weighting factors $WF_1$ to $WF_3$ correspond to the sine value of said respective phase angles $\phi_1$ to $\phi_3$, i.e. sin $\pi/4$, sin $\pi/2$ and sin $3\pi/4$ or 0.7, 1 and 0.7.

The use of these mixing signals $MS_1$ to $MS_3$ with $\Delta\phi$ being $\pi/4$ and weighting factors $WF_1$ to $WF_3$ equalizing respectively 0.7, 1 and 0.7, causes all higher order harmonic interferences up to the fifth order to be eliminated from the output signal of the adder circuit ADD.

FIG. 3A shows how to determine the mutual phase difference between two phase consecutive mixing signals and the weighting factors WF1 to WF4 in a multiplier device according to the invention for an elimination of the third, fifth and seventh order harmonic interferences, i.e. for n=4.

FIGS. 3B to 3D show respectively first to fourth mutually identical, substantially square wave mixing signals $MS_1$ to $MS_4$ with 50% duty cycle having respective phase angles $\phi_1$ to $\phi_4$ corresponding to $\Delta\phi$, $2\Delta\phi$, $3\Delta\phi$ and $4\Delta\phi$. Herein $\Delta\phi$ is the mutual phase difference between each two phase consecutive mixing signals corresponding to $\pi/(n+1)$, for n=4 being $\pi/5$. The weighting factors $WF_1$ to $WF_4$ correspond to the sine value of said respective phase angles $\phi_1$ to $\phi_4$, i.e. sin $\pi/5$, sin $2\pi/5$, sin $3\pi/5$ and sin $4\pi/5$ or 0.59, 0.95, 0.95 and 0.59.

The use of these mixing signals $MS_1$ to $MS_4$ with $\Delta\phi$ being $\pi/5$ and weighting factors $WF_1$ to $WF_4$ equalizing respectively 0.59, 0.95, 0.95 and 0.59 0.7, 1 and 0.7, causes all higher order harmonic interferences up to the ninth order to be eliminated from the output signal of the adder circuit ADD.

FIG. 4A shows an embodiment of a mixing signal generator MSG as used in the mixer device of FIG. 1, comprising a local oscillator circuit LOC generating a clock control signal with clock frequency n*fo being supplied through a frequency divider FD with dividing factor n to a serial arrangement of first to $n^{th}$ phase shifting means, each of said first to $n^{th}$ phase shifting means D1 to Dn, comprising a D-flip-flop being clock controlled by said clock control signal and providing said fixed phase shift of $\Delta\phi$. Mixing signals $MS_1$ to $MS_n$ are being supplied from respectively outputs of said first to $n^{th}$ phase shifting means D1 to Dn to said first to $n^{th}$ multipliers $M_1$ to $M_n$.

FIG. 4B shows a mixing signal waveform which deviates from rectangular due to the smoothing effect of one (bold line) or two (bold and dotted lines) timeconstants occurring at high frequencies. Such substantially square waveform mixing signals do not jeopardize the suppression of undesired higher order harmonic interferences in a multiplier device according to the invention provided they are mutually identical.

In the above, the present invention has been described with reference to a disclosure and drawings that illustrate a preferred embodiment. Persons skilled in the art would however from inspecting thereof recognize various changes and amendments to such preferred embodiment. For example, the mixing signal generator MSG may well use other configurations of delay circuits and/or frequency dividers to obtain the above mixing signals according to the invention.

Therefore, the disclosure herein should be considered by way of example, rather than by way of restriction, and the due scope of the present invention should be determined from the Claims appended hereto.

The invention claimed is:

1. A multiplier device comprising:
   first to $n^{th}$ multipliers $M_1$ to $M_n$ that are configured to multiply a carrier modulated information signal with first to $n^{th}$ mutually phase shifted and identical, substantially square wave mixing signals $MS_1$ to $MS_n$ with 50% duty cycle, wherein n is greater than 2,
   first to $n^{th}$ weighting circuits with respective fixed weighting factors $WF_1$ to $WF_n$ that are configured to receive corresponding outputs of the multipliers $M_1$ to $M_n$, and to produce therefrom corresponding weighted outputs an adder circuit that is configured to provide a sum of the weighted outputs, wherein:

the mixing signals $MS_1$ to $MS_n$ have respective phase angles $\phi_i$ corresponding to $\phi_i = i*\Delta\phi$, and the weighting factors $WF_i$ correspond to sine values of said respective phase angles $\phi_i = i*\Delta\phi$, with $\Delta\phi$ being the mutual phase difference between each two phase consecutive mixing signals corresponding to $\pi/(n+1)$ and i varying from 1 to n.

2. The multiplier device of claim 1, wherein n corresponds to $(N+1)/2$ for an elimination of all harmonics up to the $N^{th}$ order from an output of the adder circuit.

3. The multiplier device of claim 2, wherein the mixing signals $MS_1$ to $MS_n$ are derived from a local oscillator signal with frequency fo.

4. The multiplier device of claim 3, including
a plurality of fixed phase shift devices that are configured to receive the local oscillator signal and provide therefrom the mixing signals.

5. The multiplier device of claim 3, including
a plurality of frequency dividers that are configured to receive the local oscillator signal and provide therefrom the mixing signals.

6. The multiplier device of claim 3, including
a local oscillator circuit, and
a serial arrangement of first to $n^{th}$ phase shifters that is configured to receive an oscillator signal with frequency fo from the local oscillator circuit, each phase shifter providing a fixed phase shift of $\Delta\phi$ and supplying respectively mixing signals $MS_1$ to $MS_n$ to the first to $n^{th}$ multipliers $M_1$ to $M_n$.

7. The multiplier device of claim 6, wherein the local oscillator circuit includes:
an oscillator that is configured to provide a clock control signal with clock frequency n*fo, and
a frequency divider with dividing factor n that is configured to receive the clock control signal and to provide a frequency divided output signal to the serial arrangement of first to $n^{th}$ phase shifters, each phase shifter including a D-flip-flop that is clock controlled by the clock control signal to provide the fixed phase shift of $\Delta\phi$.

8. The multiplier device of claim 1, wherein the mixing signals $MS_1$ to $MS_n$ are derived from a local oscillator signal with frequency fo.

9. The multiplier device of claim 8, including:
a local oscillator circuit, and
a serial arrangement of first to $n^{th}$ phase shifters that is configured to receive an oscillator signal with frequency fo from the local oscillator circuit, each phase shifter providing a fixed phase shift of $\Delta\phi$ and supplying respectively mixing signals $MS_1$ to $MS_n$ to the first to $n^{th}$ multipliers $M_1$ to $M_n$.

10. The multiplier device of claim 9, wherein the local oscillator circuit includes:
an oscillator that is configured to provide a clock control signal with clock frequency n*fo,
a frequency divider with dividing factor n that is configured to receive the clock control signal and to provide a frequency divided output signal to the serial arrangement of first to $n^{th}$ phase shifters, each phase shifter including a D-flip-flop that is clock controlled by the clock control signal to provide the fixed phase shift of $\Delta\phi$.

11. The multiplier device of claim 8, including
a plurality of fixed phase shift devices that are configured to receive the local oscillator signal and provide therefrom the mixing signals.

12. The multiplier device of claim 8, including
a plurality of frequency dividers that are configured to receive the local oscillator signal and provide therefrom the mixing signals.

* * * * *